(12) United States Patent
Joris et al.

(10) Patent No.: US 11,098,864 B2
(45) Date of Patent: Aug. 24, 2021

(54) MODULAR LUMINAIRE HEAD

(71) Applicant: Schreder S.A., Brussels (BE)

(72) Inventors: Philippe Joris, Hasselt (BE); Guy Pluimers, Awans (BE); Laurent Maghe, Viemme (BE)

(73) Assignee: Schreder S.A., Brussels (BE)

( * ) Notice: Subject to any disclaimer, the term of this patent is extended or adjusted under 35 U.S.C. 154(b) by 0 days.

(21) Appl. No.: 16/631,807

(22) PCT Filed: Jul. 5, 2018

(86) PCT No.: PCT/EP2018/068196
§ 371 (c)(1),
(2) Date: Jan. 16, 2020

(87) PCT Pub. No.: WO2019/015976
PCT Pub. Date: Jan. 24, 2019

(65) Prior Publication Data
US 2020/0166187 A1    May 28, 2020

(30) Foreign Application Priority Data
Jul. 19, 2017    (BE) .................................. 2017/5514

(51) Int. Cl.
*F21S 8/08*    (2006.01)
*H01L 25/075*    (2006.01)
(Continued)

(52) U.S. Cl.
CPC ................ *F21S 8/086* (2013.01); *F21V 3/00* (2013.01); *F21V 23/001* (2013.01);
(Continued)

(58) Field of Classification Search
CPC .. F21S 8/086; F21S 8/08; F21V 29/89; F21V 3/00; F21V 23/001; F21V 23/003;
(Continued)

(56) References Cited

U.S. PATENT DOCUMENTS 8,899,786 B1    12/2014    Moghal et al.
2013/0100673 A1*    4/2013    Kurkofka ................ F21V 23/02
362/249.06

(Continued)

OTHER PUBLICATIONS

PCT International Search Report and Written Opinion, PCT International Application No. PCT/EP2018/068196, dated Aug. 23, 2018, 10 pages.

*Primary Examiner* — Tracie Y Green
(74) *Attorney, Agent, or Firm* — McDonnell Boehnen Hulbert & Berghoff LLP

(57) ABSTRACT

A luminaire head comprising: a mounting plate made of a thermally conductive material and having a first surface and a second surface; a light module provided at the first surface of the mounting plate comprising a support substrate in contact with the first surface of the mounting plate such that the support substrate and the mounting plate are thermally connected, at least one light emitting element disposed on the support substrate, a cover comprising a portion in a transparent or a translucent material, said cover extending over the support substrate and being fixed to the mounting plate such that light emitted by the at least one light emitting element is emitted through the portion in a transparent or a translucent material, a seal arranged between the cover and the first surface of the mounting plate; said seal surrounding the support substrate.

22 Claims, 8 Drawing Sheets

(51) Int. Cl.
- *F21V 31/00* (2006.01)
- *F21V 23/00* (2015.01)
- *F21V 29/89* (2015.01)
- *F21V 3/00* (2015.01)
- *F21Y 115/10* (2016.01)
- *F21W 131/103* (2006.01)

(52) U.S. Cl.
CPC ............ *F21V 23/003* (2013.01); *F21V 29/89* (2015.01); *F21V 31/005* (2013.01); *H01L 25/0753* (2013.01); *F21W 2131/103* (2013.01); *F21Y 2115/10* (2016.08)

(58) Field of Classification Search
CPC ............... F21V 31/005; H01L 25/0753; F21Y 2115/10; F21Y 2105/00; F21W 2131/103; F16B 2/065; F16B 9/05
See application file for complete search history.

(56) References Cited

U.S. PATENT DOCUMENTS

| | | | |
|---|---|---|---|
| 2013/0155673 A1* | 6/2013 | Wang | ..................... F21V 17/02 362/235 |
| 2016/0053952 A1 | 2/2016 | Kuti et al. | |
| 2016/0161093 A1 | 6/2016 | Peter et al. | |

* cited by examiner

MODULAR LUMINAIRE HEAD

CROSS-REFERENCE TO RELATED APPLICATION

The present application is a national stage entry of PCT/EP2018/068196 filed Jul. 5, 2018, which claims priority to BE 20175514 filed on Jul. 19, 2017, the contents of each of which are hereby incorporated by reference.

FIELD OF INVENTION

The present invention relates to luminaire heads. Particular embodiments relate to a luminaire head for outdoor applications.

By outdoor luminaire, it is meant luminaires which are installed on roads, cycle paths, tunnels, pedestrian paths or in pedestrian zones, for example, and which can be used notably for the lighting of roads and residential areas in the public domain, as well as the lighting of private parking areas and access roads to private building infrastructures.

BACKGROUND

Currently, an outdoor luminaire head is made of a casing in which all the components, e.g. driver, surge protection device, printed circuit board, LEDs, lens, heat sink, pole fixation, are integrated. Such casing is produced by injecting or extruding a compound such as metal or plastic into a mold. The molding is usually costly and further requires a certain amount of time for producing the necessary mold. One needs a luminaire head less reliant on molded elements while still providing a protection against external intrusion.

Different solutions exist for luminaire heads which rely on a less complex casing design. However, at the time of the present invention, luminaire heads with no or few molded elements in combination with a robust and simple design are not known despite the gain in cost and time it would provide. At the same time it is desirable to be able to easily adapt the size of the luminaire head depending on the desired use. Hence there is a need for a modular luminaire head presenting these characteristics.

SUMMARY

The object of embodiments of the invention is to provide a luminaire head which is easier to manufacture and allows a larger modularity. More in particular, embodiments of the invention aim to provide a luminaire head simpler in its structure allowing easier changes to its design and components.

According to a first aspect of the invention there is provided a luminaire head. The luminaire head comprises:
 a mounting plate made of a thermally conductive material and having a first surface and a second surface;
 a light module provided at the first surface of the mounting plate comprising:
  a support substrate in contact with the first surface of the mounting plate such that the support substrate and the mounting plate are thermally connected;
  at least one light emitting element disposed on the support substrate;
  a cover comprising a portion in a transparent or a translucent material, said cover extending over the support substrate and being fixed to the mounting plate, such that light emitted by the at least one light emitting element is emitted through the portion in a transparent or a translucent material;
  a seal arranged between the cover and the first surface of the mounting plate, said seal surrounding the support substrate.

Embodiments of the invention are based inter alia on the insight that luminaire heads are generally incorporating molded elements encapsulating different components. Molded elements are costly, of complex design, and can be the cause of delays in the fabrication line. To overcome the problem of a complex luminaire head composed of molded elements, a luminaire head based on a mounting plate has been chosen. The mounting plate serves as a mounting support for components of the luminaire head, such as the light module. In that manner there is provided an easy access to the components for maintenance for example, as well as the possibility to add and remove components for a greater modularity. The light module comprises a support substrate with at least one light emitting element disposed on its surface, in contact with the mounting plate so that the mounting plate can dissipate the heat generated while in use. To protect the at least one light emitting element against external intrusion such as dust, water, external impacts, etc., a cover extends over the support substrate. A seal is arranged between the cover and the mounting plate to improve the protection against external intrusion.

In a preferred embodiment the mounting plate is a flat plate. This is one of the simplest and cheapest designs allowing for a convenient mounting of any components on the first or second surface of the mounting plate.

In a preferred embodiment, the mounting plate and the cover form the actual housing of the luminaire head. This implies that the mounting plate is not arranged in a further housing or casing, and that the mounting plate and the housing form a substantially closed assembly. Further the mounting plate may be attached to a support pole or other base, e.g. using a fastener means as will be further described below.

In a preferred embodiment, the mounting plate shape and dimensions can be freely adapted depending on the intended use to be able to host additional components for example, or to be more aesthetically pleasing. The thickness of the plate can be adapted to both ensure enough rigidity of the luminaire head as well as enough heat dissipation from the light module.

Preferably the support substrate is a printed circuit board, with at least one light emitting element, e.g. at least one LED, disposed on its surface. The printed circuit board is in contact with the mounting plate so that the mounting plate can dissipate the heat generated while in use.

In an exemplary embodiment the cover has at least a portion made of transparent or translucent material, e.g. optical grade silicone, glass, polycarbonate (PC), poly(methyl methacrylate) (PMMA), to let light from the at least one light emitting element going through. The cover may be made partly or entirely of transparent or translucent material.

In a preferred embodiment, the cover is fixed to the mounting plate via a plurality of fixing means. The plurality of fixing means may include any one or more of the following: rivet, screw, screw and nut, hole, retractable insert, threaded welded rod, clips. Alternatively or in addition, the cover may be adhered, e.g. by gluing, to the mounting plate.

The cover may be made of one or several parts. For example the cover may comprise a framing portion surrounding the support substrate, and a transparent portion mounted on the framing portion and placed over the at least one light emitting element to let light through.

In an exemplary embodiment the seal is configured to provide protection against external intrusion up to an IP66 rating. Especially for outdoor luminaires such a rating is advantageous. According to a preferred embodiment, the seal is formed as a loop made of a compressible material. In this manner, the degree of water-tightness of the seal is improved.

According to an exemplary embodiment, a component is mounted on the mounting plate. The component may be an electronic or non-electronic device, e.g. a driver, a heat dissipation device, a fastener means, a control module, a camera, a sensor, a solar panel, a surge protection device, etc. According to another exemplary embodiment, a housing, e.g. in plastic, may be fixed on the mounting plate to cover all components located on the second surface of the mounting plate, for esthetical purpose.

According to an exemplary embodiment, the mounting plate is provided with a through-hole in an area surrounded by the seal; and the luminaire head further comprises a component mounted on the second surface; and a connection cable for connecting the component and extending through the through-hole. Depending on the type of component, the cable may be connected to any element inside the light module. The cable may be an electrical cable connecting the component to the support substrate for creating an electrical connection with the at least one light emitting element on the support substrate. In another example the component may be a sensor and the cable may connect the sensor to an area in the light module.

In this way, additional functionalities may be added to the luminaire head. In particular a through-hole may allow the at least one light emitting element and a component placed on the opposite side of the mounting plate to be electrically connected by extending a connection cable through the through-hole. The light module sealing may be maintained by placing the through-hole such that it is in an area surrounded by the seal.

In a particular embodiment, when the component is sensitive to heat or generating heat, the position of the component on the opposite surface of the mounting plate may be only partially corresponding to the position of the support substrate. Indeed, during use, the light module will generate heat which will be more highly concentrated at the position of the support substrate and might prevent the normal use of the component if the component position would fully correspond to the one of the support substrate.

According to a preferred embodiment, a component cover is arranged over the component on the second surface of the mounting plate; the component cover is fixed to the mounting plate; and a further seal is arranged between the component cover and the second surface of the mounting plate, such that the further seal surrounds the through-hole.

In this manner, a component cover fixed to the mounting plate and arranged over the component acts as a protection against external intrusion. The addition of a seal between the component cover and the mounting plate improves the protection, e.g. up to an IP66 rating. Further arranging the seal such that it surrounds both the component and the through-hole may seal completely a volume containing the support substrate with the at least one light emitting element, the component, and the connection cable. Thus the purpose of protecting the at least one light emitting element and the component is achieved.

According to an exemplary embodiment, the luminaire head comprises a component mounted on the first surface of the mounting plate; and the cover which extends over the support substrate further extends over said component mounted on the first surface.

In this way, both the component and the support substrate with the at least one light emitting element are on the same side of the mounting plate. Thus, only one cover is needed to house both the component and the light module. Moreover, no through-hole is needed.

In another exemplary embodiment the luminaire head comprises a component mounted on the first surface of the mounting plate; and a separate component cover extending over said component mounted on said first surface. In other words, two separate covers may be provided: one to protect the at least one light emitting element and another one to protect the component. In this way, the cover which extends over the at least one light emitting element may be provided in a transparent or translucent material, and the component cover may be provided in any suitable material.

According to a preferred embodiment, the luminaire head comprises a sealed housing mounted on the first surface or on the second surface of the mounting plate; and a component is arranged in the sealed housing. Preferably a cable connects said component with an area in the lighting module, in a sealed manner.

In this manner, a simpler housing may be designed to house and protect the component. The positioning of the component and the at least one light emitting element are independent from each other as long as the cable connects them in a sealed manner. Moreover it is easier to replace the different parts of the luminaire head during maintenance.

According to an exemplary embodiment, the component is a driver configured for controlling a provision of power to the at least one light emitting element.

In this way, a driver may be added in a modular manner to the luminaire head to control the provision of power to the at least one light emitting element.

According to a preferred embodiment, the luminaire head further comprises:
  a fastener means for fixing the mounting plate to a base, preferably an upper end of a lamp post. The fastener means may be mounted on the first surface or on the second surface of the mounting plate.

In this manner, the luminaire head may be fixed to a base. The fastener means may be any means adapted to fit the intended base. It may be, for example, a block comprising screws, nuts, and/or bolts.

According to an exemplary embodiment, the fastener means comprises a U-shaped fastener.

In this way, the luminaire head may be easily fixed to a tubular upper end of a base. The opening defined by a U-shaped fastener and the mounting plate may be tightened around the tubular upper end of a base for a secure and simple fastening.

According to a preferred embodiment, the fastener means comprises a fastener block fixed on the mounting plate, said fastener block comprising a stepped support surface such that a position of the mounting plate with respect to the base is adjustable.

In this manner, the fastener means can be replaced on the mounting plate. Moreover the positioning of the luminaire head with respect to the illuminated area may be adapted via changing the angle of the luminaire head.

According to an exemplary embodiment, the mounting plate comprises at least one element designed for improving the stiffness of the mounting plate, said element comprising at least one of the following:
  a folded portion;
  a welded portion;
  an embossed portion.

In this way, the structural rigidity of the mounting plate may be improved. The use of additional portions to improve the stiffness of the mounting plate may allow a greater variety in the design of the mounting plate. Additionally, stiffness may be improved that way without the use of molded parts in the luminaire head.

According to a preferred embodiment, the luminaire head further comprises:

a heat radiation module containing a thermally conductive material, said heat radiation module being mounted on the second surface of the mounting plate opposite to the at least one light emitting element.

In this manner, the heat generated during use may be more efficiently dissipated. The heat radiation module may consist of a block in a thermally conductive material, preferably metal, more preferably aluminum, with fins to offer a greater surface area for the dissipation of heat.

Additionally the air flow around the light module may be improved by the addition of openings in the mounting plate in proximity of the support substrate, thus improving the cooling of the light module.

According to an exemplary embodiment, the mounting plate is in metal, preferably in aluminum.

In this way, the mounting plate may be easily fabricated and may have a good thermal capacity while reducing the material cost.

According to a preferred embodiment, the mounting plate has a longitudinal dimension, and a lateral dimension; and the minimum longitudinal dimension is 200 mm, and the minimum lateral dimension is 100 mm.

In this manner, a minimum surface area for a luminaire head is defined that may allow the mounting plate to support a sufficiently intense light module for an outdoor use.

According to an exemplary embodiment, at least one optical element, e.g. a lens element, is integrated in the cover; and the cover is fixed to the mounting plate such that said at least one optical element covers the at least one light emitting element.

In this way, the optical properties, such that the light distribution, the light color, etc. of light from the light module may be varied according to the intended use. The use of optical elements, such as lens elements may improve the lighting efficiency of the luminaire head. Other optical elements such as filters, collimators, etc. may also be integrated in the cover.

According to another exemplary embodiment, at least one optical element, e.g. a lens element, is mounted between the at least one light emitting element and the cover, such that the at least one optical element can manipulate the light emitted by the at least one light emitting element.

According to a preferred embodiment, the light module further comprises:

a plurality of subsets mounted on a surface of the support substrate, wherein each subset of said plurality of subsets comprises at least one light emitting element;

wherein the cover comprises a corresponding plurality of optical elements such that each subset is covered by a optical element of the plurality of optical elements.

In this manner, the luminaire head may comprise several light modules adaptable according to the desired use. Each subset may comprise light emitting elements of different colours. Each subset may comprise a plurality of light emitting elements and the plurality of subsets may be organized as an array to allow easier manufacturing.

According to an exemplary embodiment, the light module comprises a plurality of light emitting elements, preferably at least 4 light emitting elements, in particular at least 6 light emitting elements. Preferably the light module is configured to emit at least 700 lumens, or more preferably at least 1000 lumens.

In this way, a minimum number of light emitting elements for a luminaire head is defined that may allow the light module to emit sufficiently intense light for an outdoor use of the luminaire head.

According to an exemplary embodiment, the at least one light emitting element corresponds with at least one LED. Today, this is the preferred embodiment. However, also other light sources may be used, depending amongst others on the intended application of the luminaire and/or the commercial availability.

According to another aspect, the invention relates to a luminaire comprising a base and a luminaire head according to any one of the embodiments described above, wherein a fastener means fixes the mounting plate of the luminaire head to the base.

BRIEF DESCRIPTION OF THE FIGURES

This and other aspects of the present invention will now be described in more detail, with reference to the appended drawings showing a currently preferred embodiment of the invention. Like number refer to like features through the drawings.

DESCRIPTION OF EMBODIMENTS

Figure 1:
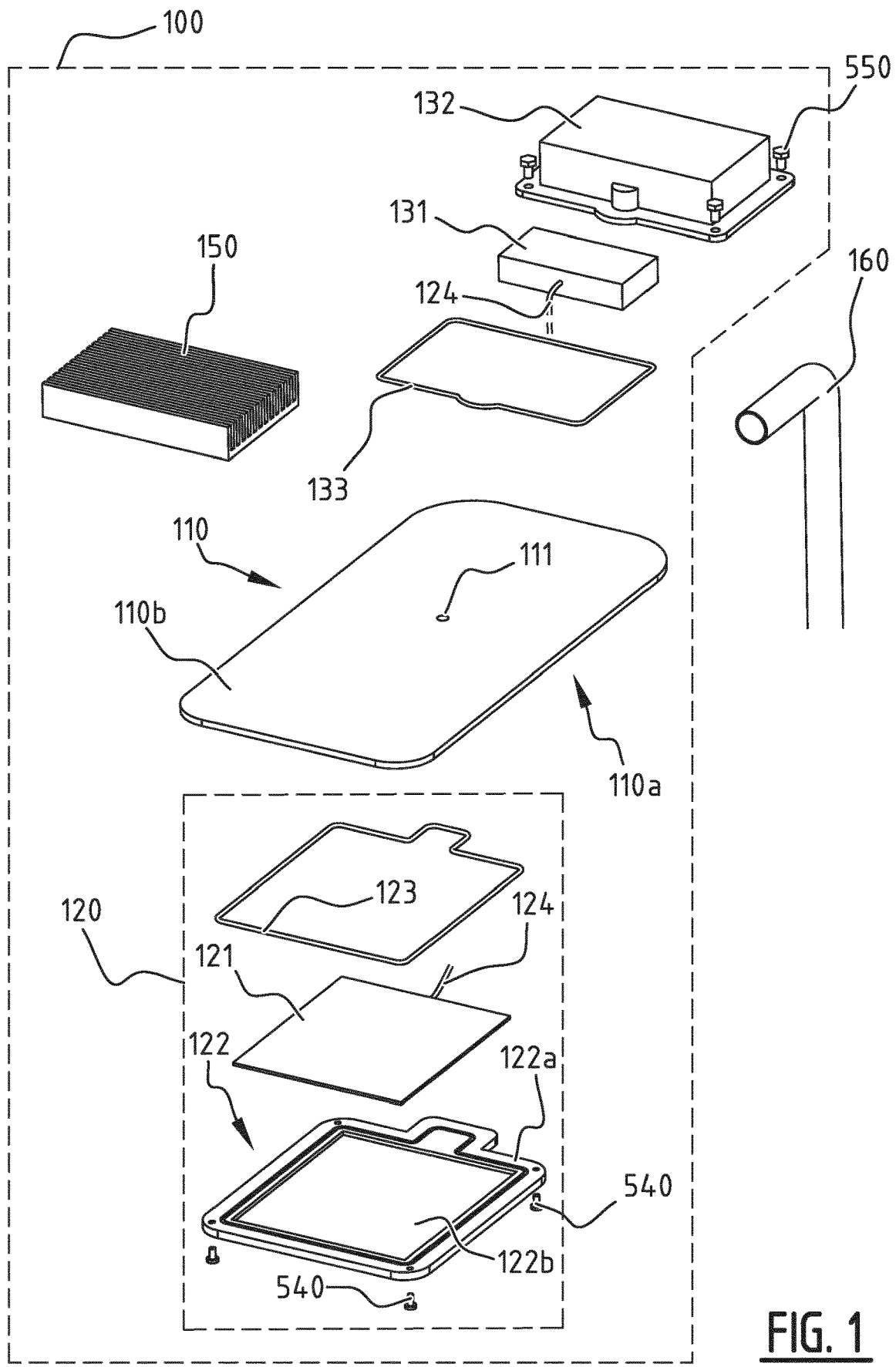
FIG. 1 shows an exploded perspective view of an exemplary embodiment of a luminaire head according to the invention.
Figures 1A, 1B:
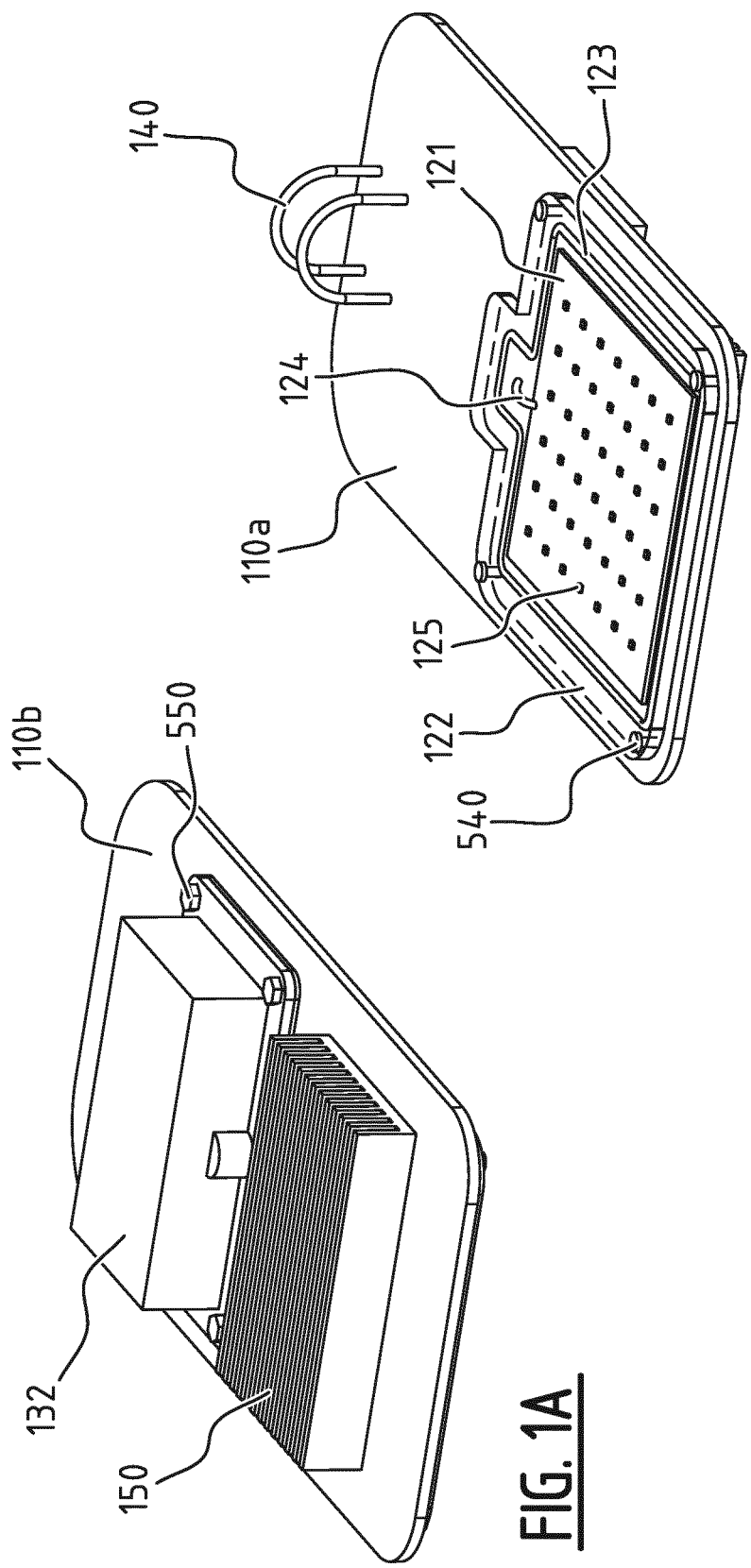
FIGS. 1A-B show corresponding perspective views.

FIG. 1 shows an exploded perspective view of an exemplary embodiment of a luminaire head according to the present invention, and FIGS. 1A-B show corresponding perspective views. The luminaire head 100 comprises a mounting plate 110, a light module 120, and various other components 131, 140, 150.

Figure 3:
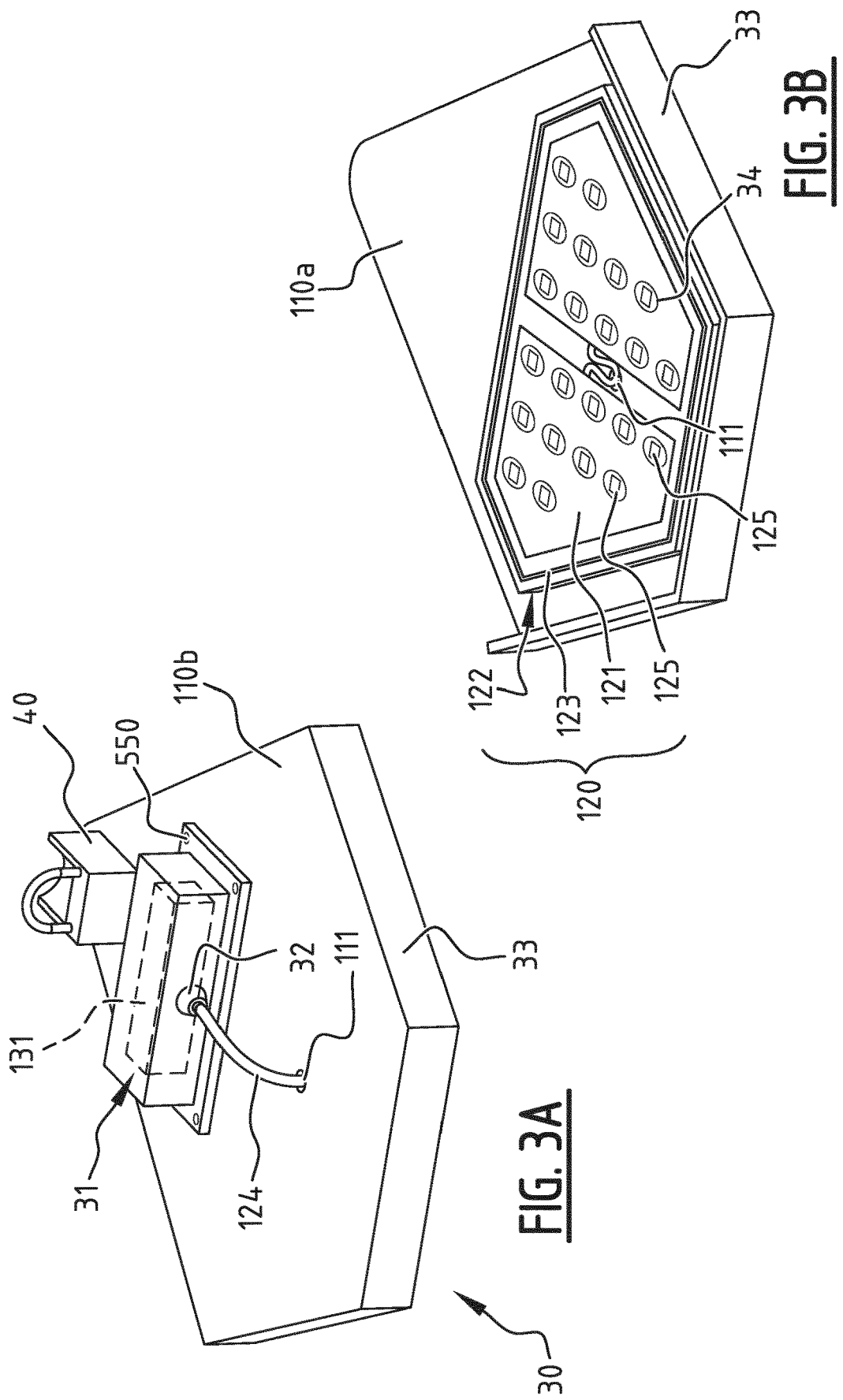
FIGS. 3A and 3B show a top and a bottom perspective view, respectively, of an exemplary embodiment of a luminaire head according to the invention.

The mounting plate 110 has a first surface 110a and a second surface 110b and is made of a thermally conductive material, preferably from a metal, more preferably from aluminum. In the exemplary embodiment shown in FIG. 1, the mounting plate 110 is shaped as a rectangular plate with rounded corners. However the skilled person will understand that this particular shape is not limitative as long as the mounting plate 110 is sufficiently rigid and can perform its function. For example, FIG. 3 illustrates an embodiment where the mounting plate 110 has a random polygonal shape, such as a diamond shape. Other shapes, such as a round or elliptic shape are also possible.

Preferably the mounting plate 110 has a minimal surface area of 100 cm$^2$, more preferably 200 cm$^2$. Preferably the mounting plate 110 is a flat plate. For example the mounting plate 110 may be a rolled plate. Preferably the mounting plate 110 is manufactured without the use of molding, injection, or extrusion.

The light module 120 comprises a support substrate 121, a cover 122, at least one LED 125 disposed on a surface of the support substrate 121, and a seal 123. The support substrate 121 may be a printed circuit board with at least one LED 125 disposed thereon. The support substrate 121 is mounted on the first surface 110a of the mounting plate 110 such that the support substrate 121 and the mounting plate 110 are in thermal contact.

The plurality of LEDs 125 disposed on the support substrate 121 may describe an array, e.g. an array of a plurality of rows by a plurality of columns. The size of the array may be designed depending on the intended use of the luminaire head, e.g. walk path illumination, large road, park, etc. The plurality of LEDs 125 may be a plurality of subsets, wherein each subset may comprise at least one LED 125. The surface of the mounting plate 110 may be designed preferably for large luminaires comprising at least eight to sixteen LEDs. In another embodiment, the surface of the mounting plate 110 may be designed for small luminaires comprising between four to eight LEDs.

A cover 122 having a translucent or transparent portion extends over the support substrate 121 and is fixed to the mounting plate 110 such that light emitted by the at least one LED is emitted through the translucent or transparent portion of the cover 122. The cover 122 may be made partially or entirely of the translucent or transparent material. The transparent or translucent portion may be e.g. in optical grade silicone, glass, PMMA, PC. The cover 122 may comprise a peripheral portion 122a and a recess portion 122b. The recess portion 122b may house the support substrate 121 with the at least one LED 125 disposed thereon. The peripheral portion 122a may be in contact with the first surface 110a and the seal 123. The seal 123 surrounds the support substrate 121 and is arranged between the cover 122 and the first surface 110a of the mounting plate 110. A plurality of fixing means 540 may enable the cover 122 to be fixed. The plurality of fixing means 540 may be placed between the seal 123 and the edge of the peripheral portion 122b. The plurality of fixing means 540 may include any of the following: rivet, screw, screw and nut, hole, retractable insert, threaded welded rod, clips, etc.

The seal 123 associated to the support substrate 121, the cover 122, and the mounting plate 110 may protect the light module 120 against intrusion, preferably at a rating of IP66. The seal 123 may be formed as a loop and be made of a compressible material, e.g. rubber. As can been seen in the embodiment of FIG. 1, a through-hole 111 is provided through the mounting plate 110. In this particular case, the seal 123 is arranged such that the seal 123 surrounds the through-hole 111 as well as the support substrate 121.

The luminaire head 100 may further comprise a component 131 mounted on the second surface 110b of the mounting plate 110. A connection cable 124 extending through the through-hole 111 may connect electrically the component 131 and the at least one LED 125. The component 131 may be arranged in a component cover 132. The component cover 132 may be fixed to the mounting plate 110 by a similar fixing means 550 as the cover 122. Another seal 133 may be arranged between the component cover 132 and the second surface 110b of the mounting plate 110 such that the seal 133 surrounds the component 131 as well as the through-hole 111. The seal 133 associated to the component 121, the component cover 132, and the mounting plate 110 may protect the component 132 against intrusion, preferably at a rating of IP66. In such a way, both the component 131 and the at least one LED 125 are protected. In that manner, the positioning of the component cover 132 with respect to the light module 120 may be designed so that it corresponds at least partially to the position of the light module 120 on the opposite surface of the mounting plate 110, preferably not fully corresponding to the position of the light module 120.

An additional component may be mounted on the mounting plate 110. As shown in the exemplary embodiment of FIG. 1, it may be a heat radiation module 150. The heat radiation module 150 is preferably provided opposite of the support substrate 121. In another exemplary embodiment, the additional component may be another electronic or non electronic component, e.g. a control module, a solar panel, a camera module, one or more sensors, etc. The additional component may be arranged in a sealed housing mounted on the mounting plate 110 or may be protected by a cover fixed to the mounting plate 110, depending on the required protection of the component.

The luminaire head 100 may further comprise a fastener means 140 for fixing the mounting plate 110 to a base, preferably an upper end of a lamp post 160. In the exemplary embodiment shown in FIG. 1, the fastener means 140 are U-shaped. The upper end of the lamp post 160 will fit in an opening defined by the U of the fastener means 140 and the first surface 110a of the mounting plate 110. In the illustrated embodiment the fastener means 140 is provided on the first surface 110a and nuts provided on the second surface 110b of the mounting plate 110 will allow tightening the opening around the upper end 160 to fix the luminaire head 100 to the upper end 160. The fastener means 140 may instead be provided on the second surface 110b of the mounting plate 110 or comprise a fastener block 40, as will be described in detail below with reference to FIG. 4. In another exemplary embodiment, the lamp post 160 may be provided with a fitting section having a fixing section screwed to the mounting plate 110 and having the fitting section positioned in, on or over the upper end of the lamp post 160, as will be described in detail below with reference to FIG. 6.

Figure 2:
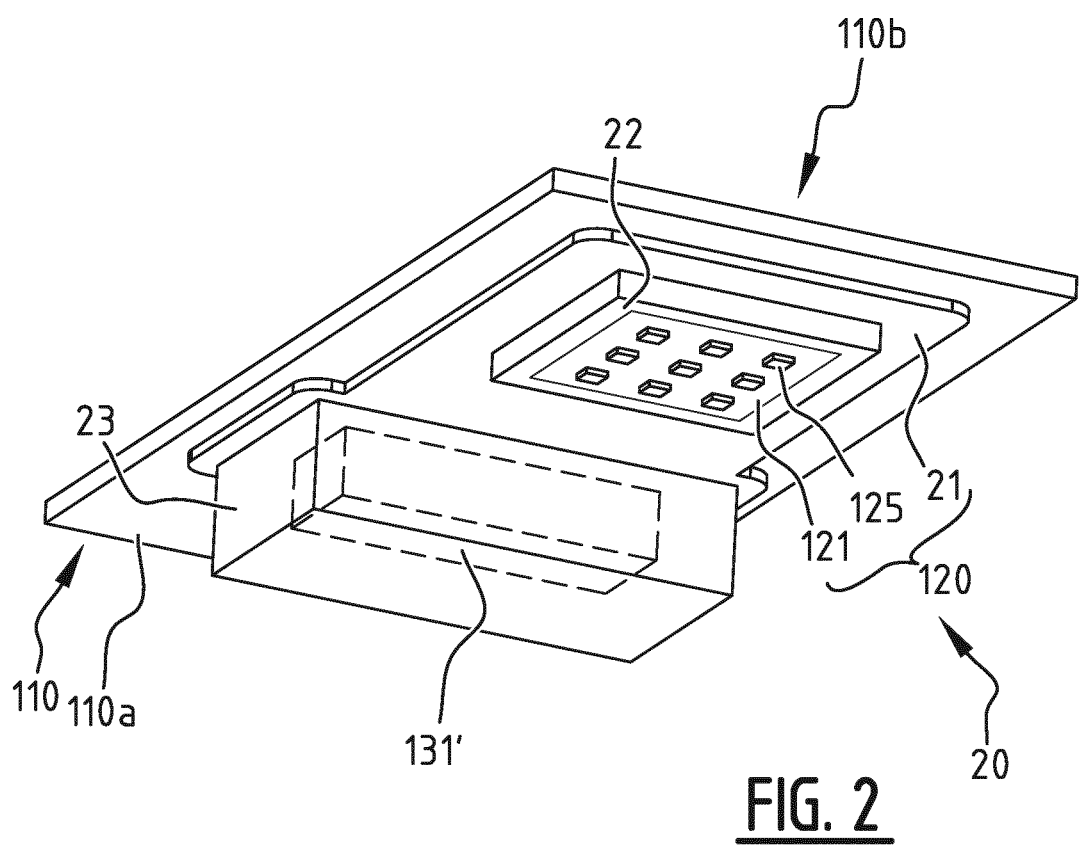
FIG. 2 shows a perspective view of an exemplary embodiment of a luminaire head according to the invention.

FIG. 2 shows a perspective view of an exemplary embodiment of a luminaire head according to the present invention. The luminaire head 20 comprises a mounting plate 110, and a light module 120. The light module 120 comprises a support substrate 121, a cover 21, and a plurality of LEDs 125 disposed on a surface of the support substrate 121.

The mounting plate 110 of the presently described embodiment is of rectangular shape and has a first surface 110a and a second surface 110b. The support substrate 121 is in thermal contact with the mounting plate 110 and is fixed to the first surface 110a by a plurality of fixing means 540 (not shown). The plurality of LEDs 125 disposed on the support substrate 121 describes an array of a plurality of rows by a plurality of columns.

The plurality of LEDs 125 is connected via conductive paths (not shown) on the support substrate 121 and a cable (not shown) to a component 131', e.g. a driver, mounted on the first surface 110a of the mounting plate 110. A component cover portion 23 of the cover 21 may house the component 131'. The plurality of LEDs 125 is emitting light through a transparent cover portion 22 of the cover 21. The cover 21 is sealed by a seal (not visible in FIG. 2 but shown in a similar embodiment as seal 521 in FIG. 5B) arranged around the support substrate 121 and the component 131'. In this manner only one cover 21 is needed for housing both the component 131' and the support substrate 121. Additionally, only one seal is needed. In other embodiments there may be provided two separate covers for the component 131' and the support substrate 121, see the exemplary embodiment of FIG. 5D which will be discussed below.

FIGS. 3A and 3B show a top and a bottom perspective view, respectively, of an exemplary embodiment of a luminaire head according to the present invention. The luminaire head 30 comprises a mounting plate 110, and a light module 120. The light module 120 comprises two support substrates 121, a cover 122, a plurality of LEDs 125 disposed on a surface of the support substrates 121, and a seal 123 between the cover 122 and the mounting plate 110.

As depicted in the exemplary embodiment of FIGS. 3A-B, the mounting plate 110 may have a shape different from a rectangular shape, e.g. a polygonal shape such as a diamond shape. In other embodiments the mounting plate 110 may have a round or elliptical shape. More than one support substrates 121 may be provided at a first surface 110a of the mounting plate 110, two support substrates 121 in this particular embodiment. The support substrates 121 are mounted such that they are in thermal contact with the first surface 110a of the mounting plate 110. A number of edges, e.g. three contiguous edges of the mounting plate 110 may be provided with a folded portion 33 perpendicular to the mounting plate 110 and extending downward in the mounted position of the luminaire head. Folding portions 33 may increase the structural rigidity of the mounting plate 110. Alternative options may include using a welded portion, or an embossed portion.

A housing 31 is mounted on the second surface 110b of the mounting plate 110. The housing 31 houses a component 131 mounted and fixed to an inner surface of the housing 31. The housing 31 is sealed by construction and no additional seal is needed between the housing 31 and the mounting plate 110. The housing 31 is fixed to the second surface 110b by a plurality of fixing means 550. A connection cable 124 extends from the housing 31 and is connected to the component 131 in such a way that the connection cable 124 associated with the housing 31 is sealed. The seal between the connection cable 124 and the housing 31 may be achieved by a sealed screw cap 32. The connection cable 124 extends through a sealed through hole 111 provided to the mounting plate 110.

The plurality of LEDs 125 may be electrically connected to the component 131 on the second surface 110b of the mounting plate 110 via conductive paths on the support substrate 121 and via the connection cable 124. The connection cable 124 associated with the through-hole 111 is sealed at the first surface 110a of the mounting plate 110. The support substrates 121 may have any shape and may be mounted on the first surface 110a of the mounting plate 110, e.g. on either side of the through-hole 111. The plurality of LEDs 125 may be designed as an array of a plurality of columns, e.g. columns comprising, respectively, two LEDs, four LEDs, and five LEDs. The array may be designed according to the intended use.

The seal 123 is arranged between the cover 122 and the mounting plate 110 such that the seal 123 surrounds both the two support substrates 121 and the through-hole 111. The cover 122 may be fabricated in a transparent or translucent material. The cover 122 may comprise a plurality of lens elements 34 such that each LED 125 is covered by a corresponding lens element 34.

The luminaire head 30 may be mounted on a base using a fastener means 40 fixed on the second surface 110b of the mounting plate 110. In an alternative embodiment the fastener means 40 may be fixed on the first surface 110a. The fastener means 40 may be a fastener block such as described below.

Figure 4:
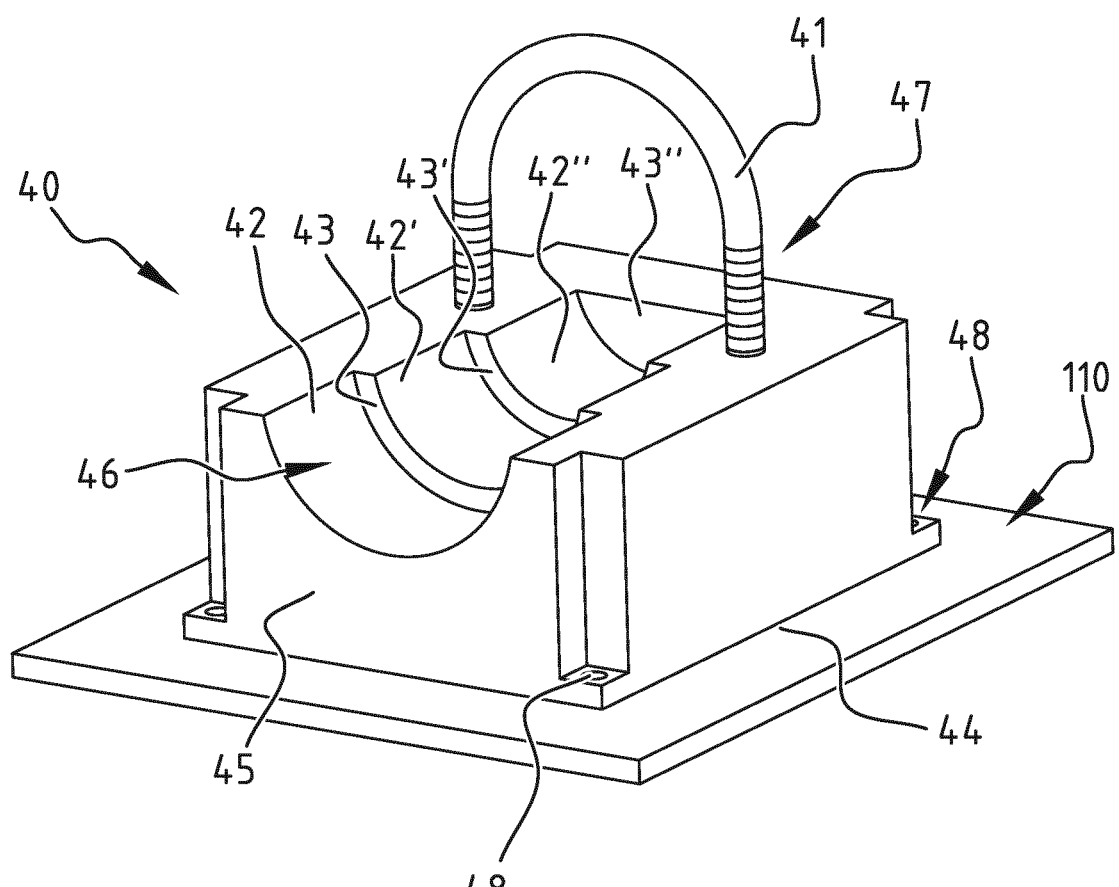
FIG. 4 shows a perspective view of an exemplary embodiment of a fastener means according to the invention.

FIG. 4 shows a perspective view of an exemplary embodiment of a fastener means according to the present invention.

A fastener block 40 may comprise a stepped support surface 46 such that a position of the mounting plate 110 with respect to the base is adjustable. In the particular embodiment of FIG. 4, a base such as a cylindrical upper end of a lamp post is considered. The upper end will engage with the fastener block 40 from the direction of an opening face 45 of the fastener block 40. The opening face 45 may extend away from a supporting face 44 of the fastener block 40. The fastener block 40 may be fixed to the mounting plate 110 of the luminaire head by a plurality of fixing means 48. The opening face 45 may comprise a partially circular opening. The partially circular opening 45 provides access to the stepped support surface 46. The stepped support surface 46 is formed by a succession of cylindrical inner surfaces 42, 42', 42" extending away from the opening surface 45 and having a decreasing diameter. The axis of the plurality of cylindrical inner surfaces 42, 42', 42" may be at an angle with respect to the supporting face 44. A plurality of butting surfaces 43, 43', 43" may be provided at an edge of each cylindrical surface 42, 42', 42". Each subsequent cylindrical surface 42', 42" may be at an incremental angle with respect to the fore cylindrical surface 42, 42'.

A U-shaped fastener 41 associated with the partially cylindrical surface may form an enclosure around the upper end of the lamp post. Tightening the fastener 41 may fix the luminaire head to the lamp post.

In FIG. 4 it is shown to arrange the fastener block 40 in a horizontal orientation on the mounting plate 110, with the supporting face 44 in contact with the mounting plate 110. In other embodiments the fastener block may be arranged in a vertical orientation, wherein a face 47 opposite the opening face 45 is supported on the mounting plate 110.

The skilled person will understand that alternative design may exist to implement the fastener block, e.g. by using two blocks tightened together comprising one or more cylindrical support surfaces on opposite sides of the base.

Figure 6:
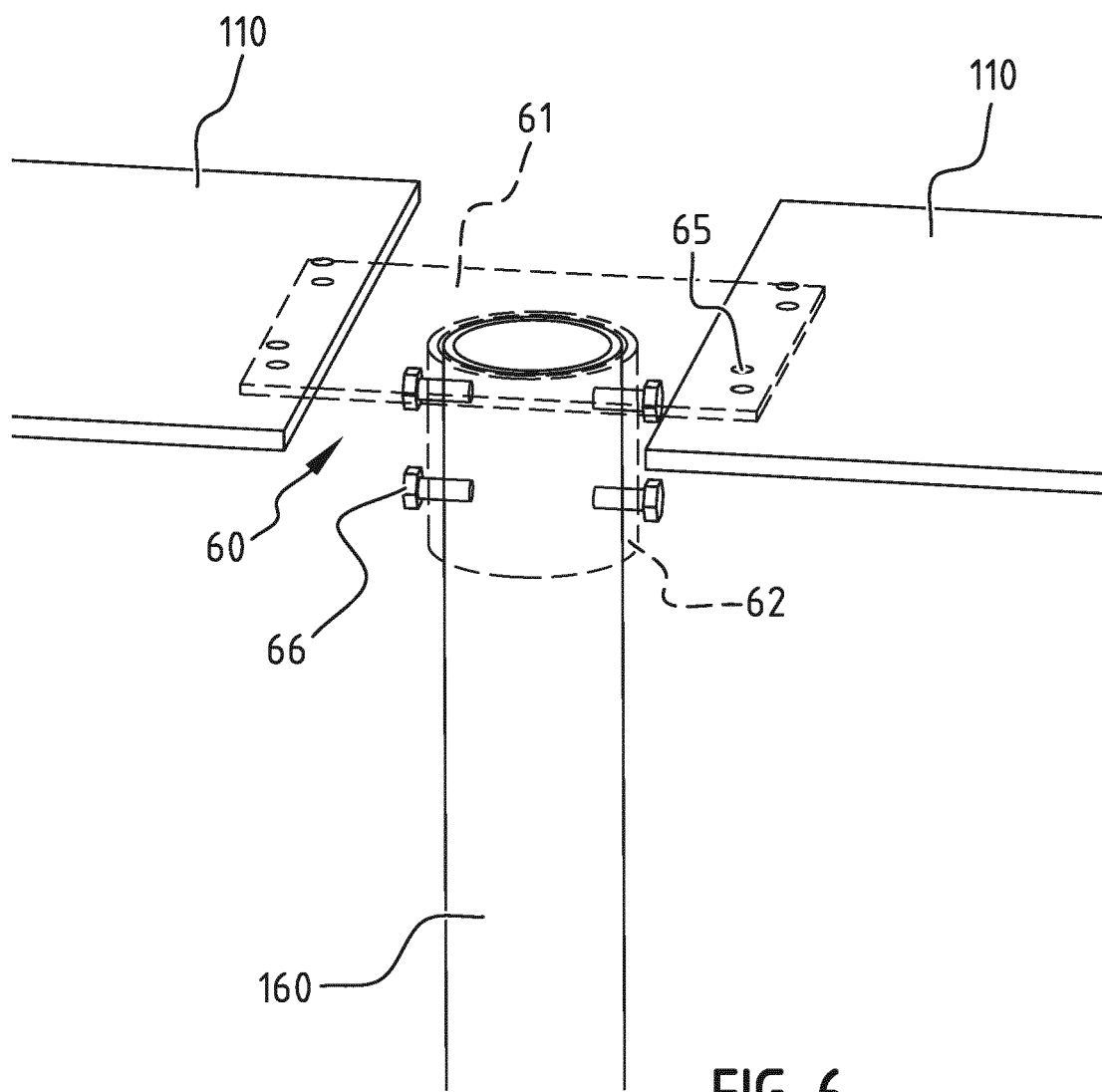
FIG. 6 illustrates a schematic perspective view of another exemplary embodiment of a fastener means according to the invention.

FIG. 6 illustrates another exemplary embodiment of a fastener means. In this embodiment, a base such as a vertical cylindrical upper end of a lamp post 160 is considered. A fastener means 60 is provided to a plurality of mounting plates 110, for example two mounting plates 110. The fastener means 60 may comprise a fixing section 61 and a fitting section 62. The plurality of mounting plates 110 is fixed to the fixing section 61 by a plurality of fixing means 65, e.g. screws. The fastener means 60 is fixed to the base by another plurality of fixing means 66.

The fitting section 62 is a tubular section extending downward in the mounted position of the luminaire head and has an inner diameter corresponding to the outer diameter of the lamp post upper end 160, such that the lamp post upper end 160 and the fitting section 62 interconnect. In this embodiment, the fastener means 60 has a fitting section 62 such that it is mounted over the upper end of the lamp post 160. In another embodiment, the fitting section 62 may be configured to fit inside the lamp post upper end 160. In other embodiments, more than two mounting plates 110 may be fixed to the fastener means 60, and the fastener means may be arranged in a vertical orientation.

FIGS. 5A-E show cross-section views of further exemplary embodiments of a luminaire head according to the present invention.

Figure 5A:
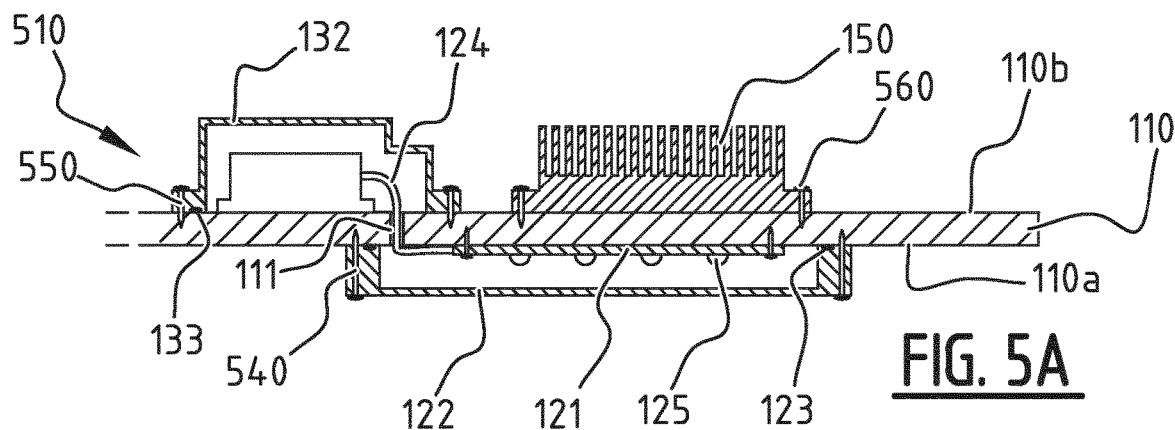
FIGS. 5A-E show cross-section views of further exemplary embodiments of a luminaire head according to the invention.

In the exemplary embodiment depicted in FIG. 5A, the luminaire head 510 comprises a mounting plate 110, and a light module. A through-hole 111 is provided through the mounting plate 110. The mounting plate 110 has a first surface 110a and a second surface 110b. Preferably the mounting plate 110 is a flat plate. For example the mounting plate 110 may be a rolled plate.

Preferably the mounting plate 110 is manufactured without the use of molding, injection, or extrusion. The light module is provided at the first surface 110a. The light module comprises a cover 122, a support substrate 121 with at least one LED 125 disposed thereon, and a seal 123. The cover 122 is in a transparent or translucent material and extends over the support substrate 121 and the through-hole 111. It is fixed to the mounting plate 110 by a plurality of fixing means 540 placed around the periphery of the cover 122. The support substrate 121 is fixed to the mounting plate 110 by a plurality of fixing means such that it is in thermal contact with the mounting plate 110. The seal 123 is arranged between the cover 122 and the mounting plate 110 such that it surrounds both the support substrate 121 and the through-hole 111. The seal 123 is placed within the boundaries defined by the plurality of fixing means 540 fixing the cover 122 to the mounting plate 110. A component 131 is provided on the second surface 110b. A connection cable 124 extending through the through-hole 111 connects the component 131 and the at least one LED 125. A component cover 132 extends over both the component 131 and a seal 133. The seal 133 is arranged in such a way that it surrounds both the component 131 and the through-hole 111 and is between the component cover 132 and the second surface 110b. A plurality of fixing means 550 maintains the component cover 132 mounted on the second surface 110b. A heat radiation module 150 is provided on the second surface 110b. It is placed opposite of the support substrate 121 and is fixed to the mounting plate 110 by a plurality of fixing means 560.

Figure 5B:
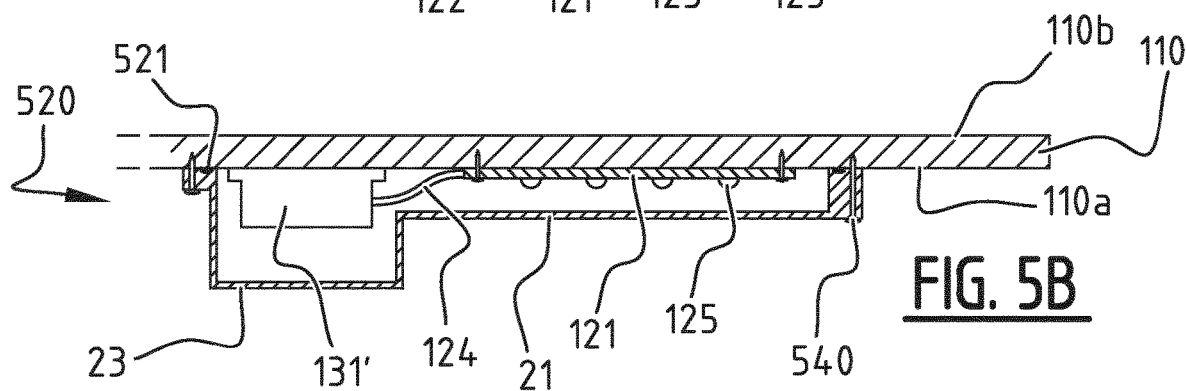

In the exemplary embodiment of FIG. 5B, the component 131' and the support substrate 121 are both provided on the first surface 110a. There is no through-hole and the connection cable 124 connects the component 131' to the at least one LED 125. A cover 21 extends over both the component 131 and the support substrate 121. The cover 21 is in a transparent or translucent material and is fixed to the mounting plate 110 by a plurality of fixing means 540. A seal 521 surrounds both the component 131' and the support substrate 121 and is arranged between the cover 21 and the mounting plate 110. The cover 21 comprises a component cover portion 23 to house the component 131'.

Figure 5C:
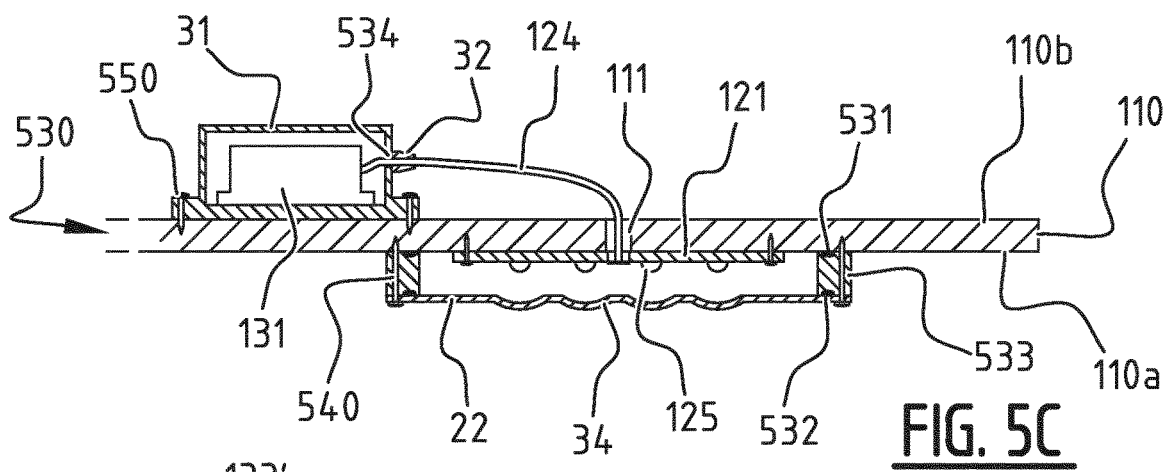

In the exemplary embodiment of FIG. 5C, the component 131 is provided in a housing 31. The housing 31 is fixed to the second surface 110b by a plurality of fixing means 550. A side through-hole 534 is provided on a side of the housing 31 such that the connection cable 124 may extend out of the housing 31. The connection cable 124 extends through the through-hole 111 to connect the component 131 and the at least one LED 125. A sealed screw cap 32 keeps the housing sealed. The support substrate 121 is provided on the first surface 110a. A cover frame 533 surrounds the support substrate 121 and the through-hole 111. A first seal 531 surrounds the support substrate 121 and the through-hole 111 and is placed between the cover frame 533 and the mounting plate 110. A cover 22 extends over the support substrate 121 and is mounted on top of the cover frame 533. The cover 22 comprises at least one lens element 34 such that said at least one lens element 34 covers the at least one LED 125. A second seal 532 is placed between the cover 22 and the cover frame 533. A plurality of fixing means 540 keeps the cover 22 and the cover frame 533 attached to the mounting plate 110.

Figure 5D:
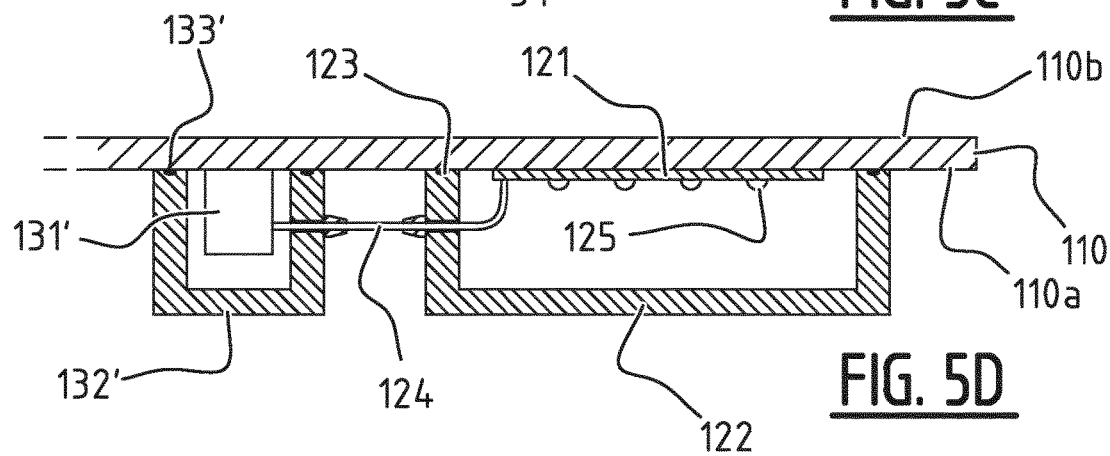

In the exemplary embodiments of FIG. 5D, two separate covers 132' and 122 are provided for the component 131' and the support substrate 121, respectively. The component 131' is mounted on the first surface 110a of the mounting plate 100; and the separate component cover 132' extends over said component 131' with a seal 133' inserted between the cover 132' and the mounting plate 110. The cover 122 protects the at least one light emitting element 125 on the support substrate 121, and the cover 132' protects the component 131'. In this way, the cover 122 which extends over the at least one light emitting element 125 may be provided in a transparent or translucent material, and the component cover 132' may be provided in any suitable material.

Figure 5E:
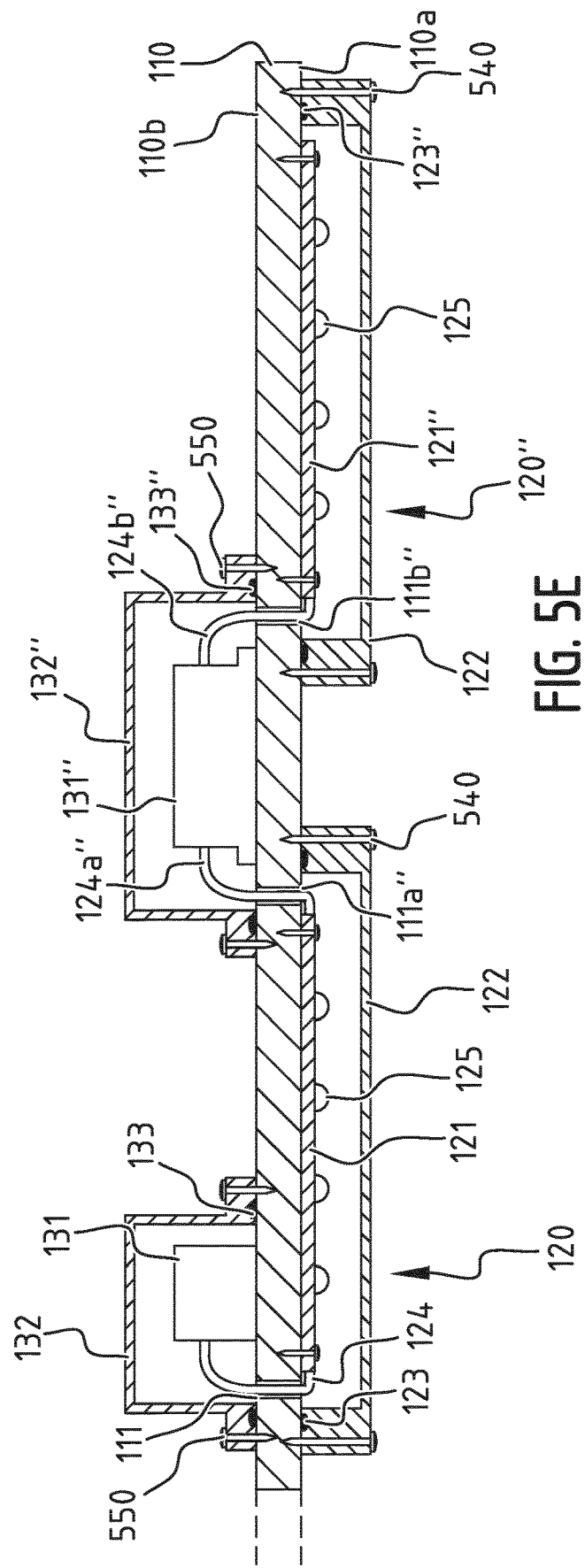

In the exemplary embodiment of FIG. 5E, a first and a second component 131, 131" are provided to the second surface 110b of the mounting plate 110. Two separate light modules 120, 120" are provided to the first surface 110a. A first, a second, and a third through-hole 111, 111a", 111b" are provided through the mounting plate 110. A first connection cable 124 extending through the first through-hole 111 connects the first component 131 and at least one LED 125 of the first light module 120. A second connection cable 124a" extending through the second through-hole 111a" connects the second component 131" and at least one LED 125 of the first light module 120. A third connection cable 124b" extending through the third through-hole 111b" connects the second component 131" and at least one LED 125 of the second light module 120". A first component cover 132 extends over both the first component 131 and a first seal 133. The first seal 133 is arranged in such a way that it surrounds the first component 131 and the first through-hole 111 and is between the first component cover 132 and the second surface 110b. A second component cover 132" extends over both the second component 131" and a second seal 133". The second seal 133" is arranged in such a way that it surrounds the second component 131" and the second and third through-holes 111a", 111b", and is between the second component cover 132" and the second surface 110b. The first seal 123 of the first light module 120 is arranged such that it surrounds the first support substrate 121 of the first light module 120 and the first and second through-holes 111, 111a". The second seal 123" of the second light module 120" is arranged such that it surrounds the second support substrate 121" of the second light module 120" and the third through-hole 111b". Further, respective covers 122 of the first and second light module 120, 120" extend over the respective first and second support substrates 121, 121" supporting the LEDs 125. A plurality of fixing means 540 fixes the covers 122 to the mounting plate 110 and a plurality of fixing means 550 fixes the first and second component covers 132, 132" to the mounting plate 110. In such an embodiment the mounting plate 110 together with the covers 122 and the first and second component covers 132, 132" can form the actual housing of the luminaire head.

The skilled person will understand that multiple configurations comprising at least one cover extending over the at least one LED and at least one compartment cover are possible based on the exemplary embodiments of FIGS. 5A-E.

The invention claimed is:

1. A luminaire head comprising:
a mounting plate made of a thermally conductive material and having a first surface and a second surface, wherein the mounting plate is a flat plate;
a light module provided at the first surface of the mounting plate comprising:
a support substrate in contact with the first surface of the mounting plate such that the support substrate and the mounting plate are thermally connected;
at least one light emitting element disposed on the support substrate;
a cover comprising a portion in a transparent or a translucent material, said cover extending over the support substrate and being fixed to the mounting plate, such that light emitted by the at least one light emitting element is emitted through the portion in a transparent or a translucent material;

a seal arranged between the cover and the first surface of the mounting plate, said seal surrounding the support substrate.

2. The luminaire head of claim 1, wherein the seal is formed as a loop made of a compressible material.

3. The luminaire head of claim 1, wherein the mounting plate is provided with a through-hole in an area surrounded by the seal; and wherein the luminaire head further comprises a component mounted on the second surface of the mounting plate.

4. The luminaire head of claim 3, further comprising a connection cable for connecting the component, said connection cable extending through the through-hole.

5. The luminaire head of claim 3, wherein a component cover is arranged over the component on the second surface of the mounting plate; and
wherein the component cover is fixed to the mounting plate; and
wherein a further seal is arranged between the component cover and the second surface of the mounting plate, such that said further seal surrounds the through-hole.

6. The luminaire head of claim 1, wherein the luminaire head comprises a component mounted on the first surface; and
wherein the cover further extends over said component mounted on the first surface.

7. The luminaire head of claim 1, wherein the luminaire head comprises a component mounted on the first surface of the mounting plate; and a component cover extending over said component mounted on the first surface.

8. The luminaire head of claim 1, wherein the luminaire head comprises a sealed housing mounted on the first surface or the second surface of the mounting plate; and wherein a component is arranged in the sealed housing.

9. The luminaire head of claim 8, further comprising a cable connecting said component in a sealed manner with an area inside the light module.

10. The luminaire head of claim 3, wherein the component is a driver configured for controlling a provision of power to the at least one light emitting element.

11. The luminaire head of claim 1, further comprising:
a fastener means for fixing the mounting plate to a base, preferably an upper end of a lamp post.

12. The luminaire head of claim 11, wherein the fastener means comprises a U-shaped fastener.

13. The luminaire head of claim 11, wherein the fastener means comprises a fastener block fixed on the mounting plate, said fastener block comprising a stepped support surface such that a position of the mounting plate with respect to the base is adjustable.

14. The luminaire head of claim 1, wherein the mounting plate comprises at least one portion designed for improving the stiffness of the mounting plate, said portion comprising at least one of the following:
a folded portion;
a welded portion;
an embossed portion.

15. The luminaire head of claim 1, further comprising:
a heat radiation module containing a thermally conductive material, said heat radiation module being mounted on the second surface of the mounting plate opposite to the at least one light emitting element.

16. The luminaire head of claim 1, wherein the mounting plate is in metal, preferably in aluminum.

17. The luminaire head of claim 1, wherein the mounting plate has a longitudinal dimension, and a lateral dimension; and
wherein the minimum longitudinal dimension is 200 mm, and the minimum lateral dimension is 100 mm.

18. A luminaire comprising a base and a luminaire head according to claim 11, wherein the fastener means fixes the mounting plate of the luminaire head to the base.

19. A luminaire head comprising:
a mounting plate made of a thermally conductive material and having a first surface and a second surface;
a light module provided at the first surface of the mounting plate comprising a support substrate and at least one light emitting element disposed on the support substrate;
a cover comprising a portion in a transparent or a translucent material, said cover extending
over the support substrate and being fixed to the mounting plate;
a seal arranged between the cover and the first surface of the mounting plate, said seal surrounding the support substrate;
a component mounted on the second surface of the mounting plate;
a component cover arranged over the component on the second surface of the mounting plate and fixed to the mounting plate; and
a further seal arranged between the component cover and the second surface of the mounting plate,
wherein the mounting plate is provided with a through-hole in an area surrounded by the seal and wherein said further seal surrounds the through-hole.

20. A luminaire head comprising:
a mounting plate made of a thermally conductive material and having a first surface and a second surface;
a light module provided at the first surface of the mounting plate comprising:
a support substrate in contact with the first surface of the mounting plate such that the support substrate and the mounting plate are thermally connected;
at least one light emitting element disposed on the support substrate;
a cover comprising a portion in a transparent or a translucent material, said cover extending over the support substrate and being fixed to the mounting plate, such that light emitted by the at least one light emitting element is emitted through the portion in a transparent or a translucent material;
a seal arranged between the cover and the first surface of the mounting plate, said seal surrounding the support substrate;
a sealed housing mounted on the first surface or the second surface of the mounting plate, wherein a component is arranged in the sealed housing;
a cable connecting the component in a sealed manner with an area inside the light module.

21. A luminaire head comprising:
a mounting plate made of a thermally conductive material and having a first surface and a second surface;
a light module provided at the first surface of the mounting plate comprising:
a support substrate in contact with the first surface of the mounting plate such that the support substrate and the mounting plate are thermally connected;
at least one light emitting element disposed on the support substrate;

a cover comprising a portion in a transparent or a translucent material, said cover extending over the support substrate and being fixed to the mounting plate, such that light emitted by the at least one light emitting element is emitted through the portion in a transparent or a translucent material;

a seal arranged between the cover and the first surface of the mounting plate, said seal surrounding the support substrate;

a fastener means for fixing the mounting plate to a base, preferably an upper end of a lamp post.

22. The luminaire head of claim 21, wherein the mounting plate comprises at least one portion designed for improving the stiffness of the mounting plate, said portion comprising at least one of the following:

a folded portion;

a welded portion;

an embossed portion.

\* \* \* \* \*